United States Patent [19]

Mukai et al.

[11] Patent Number: 5,232,674
[45] Date of Patent: Aug. 3, 1993

[54] METHOD OF IMPROVING SURFACE MORPHOLOGY OF LASER IRRADIATED SURFACE

[75] Inventors: Ryoichi Mukai, Kawasaki; Michiko Takei, Atsugi, both of Japan

[73] Assignee: Fujitsu Limited, Kanagawa, Japan

[21] Appl. No.: 896,871

[22] Filed: Jun. 10, 1992

Related U.S. Application Data

[63] Continuation of Ser. No. 628,521, Dec. 17, 1990, abandoned.

[30] Foreign Application Priority Data

Dec. 20, 1989 [JP] Japan .................................. 1-328307
Dec. 20, 1989 [JP] Japan .................................. 1-330449

[51] Int. Cl.⁵ .................................................. H01L 21/268
[52] U.S. Cl. ............................. 423/173; 219/121.73; 437/174; 437/188
[58] Field of Search .......................... 437/173, 174; 219/121.73, 121.78; 148/DIG. 90, DIG. 93; 204/157.41, DIG. 11

[56] References Cited

U.S. PATENT DOCUMENTS

| | | | |
|---|---|---|---|
| 4,758,533 | 7/1988 | Magee et al. | 437/173 |
| 4,800,179 | 1/1989 | Mukai | 437/203 |
| 4,920,070 | 4/1990 | Mukai | 437/173 |

FOREIGN PATENT DOCUMENTS

| | | | |
|---|---|---|---|
| 55-67132 | 5/1980 | Japan | 437/174 |
| 61-260621 | 11/1986 | Japan | 437/174 |
| 1-145832 | 6/1989 | Japan | 437/174 |

OTHER PUBLICATIONS

"Planarization Technique for Al Electrode Interconnection by Excimer Laser Light Irradiation", Mukai et al., Semiconductor World, Nov. 1988, pp. 83–89.

*Primary Examiner*—Olik Chaudhuri
*Assistant Examiner*—Ken Horton
*Attorney, Agent, or Firm*—Nikaido, Marmelstein, Murray & Oram

[57] ABSTRACT

A method of improving surface morphology of a laser irradiated surface includes a first step of irradiating a pulse laser beam one or a plurality of times on a region of a conductor layer which is formed on an under layer so as to melt the entire conductor layer, and a second step of irradiating a pulse laser beam on the irradiated region of the conductor layer at least once after the first step with an energy density such that only a surface portion of the conductor layer melts in substantially the entire irradiated region.

13 Claims, 6 Drawing Sheets

METHOD OF IMPROVING SURFACE MORPHOLOGY OF LASER IRRADIATED SURFACE

This application is a continuation of application Ser. No. 07/628,521 filed Dec. 17, 1990, now abandoned.

BACKGROUND OF THE INVENTION

The present invention generally relates to methods of improving surface morphology, and more particularly to a method of improving the surface morphology of a laser irradiated surface when carrying out a process such as planarization of a layer or changing a crystal state of a layer by irradiating a pulse laser on an interconnection material or the like of a semiconductor device.

For example, it is known from Semiconductor World, November 1988, p.84 to fill a via hole and to make a planarization of an interconnection using a pulse laser. According to Semiconductor World, a melted area is approximately $1 \times 0.2$ cm by one shot of the pulse laser having a pulse energy density of 1 to 10 $J/cm^2$. When filling the via hole, for example, it is necessary to carry out a positioning so as to irradiate only the region which requires the pulse laser irradiation. For this reason, the pulse laser is generally irradiated over the entire chip to avoid the troublesome positioning.

According to the conventional pulse laser irradiation, the metal of the irradiated surface melts at the center portion of the one shot beam when the pulse energy density is in the range of 5 to 10 $J/cm^2$ and higher. However, an energy density exists even within a one shot beam of the pulse laser, and the energy density at the peripheral portion of the one shot beam inevitably decreases. For this reason, the surface morphology of the irradiated surface deteriorates at the peripheral portion of the one shot beam.

FIG. 1 shows a region $1a$ which is irradiated by the one shot beam and a peripheral region $1b$. When the irradiation by the one shot beam is successively carried out in the direction of the arrow, the planarization of the interconnection occurs within the region $1a$ but the surface morphology deteriorates in the peripheral region $1b$ which is indicated by a hatching. In the figures which follow, the region where the surface morphology is deteriorated will be indicated by the hatching, and the region where the planarization takes place will be indicated by white, that is, without the hatching.

When the via hole is to be filled and planarized, the beam size of the pulse laser becomes small in order to concentrate the energy of the pulse laser at the via hole. However, because it is difficult to accurately position the one shot beam at the via hole, it is inevitable to irradiate an area having a certain size. In addition, the irradiation area must be enlarged by overlapping the irradiating regions so as to eliminate non-irradiated regions. But when the irradiating regions are overlapped, the peripheral region of the previous or next one shot overlaps the peripheral region of the present one shot, thereby further deteriorating the surface morphology and enlarging the region in which the surface morphology is deteriorated.

When the above described deterioration is generated in the surface morphology of an interconnection layer, a disconnection of the interconnection may occur. Further, in the case of a multi-level interconnection, the surface morphology becomes poorer towards the upper layers of the multi-level interconnection, thereby increasing the chances of a disconnection of the interconnection. On the other hand, when the surface morphology is poor, there is also problem in that a high precision photolithography cannot be achieved.

SUMMARY OF THE INVENTION

Accordingly, it is a general object of the present invention to provide a novel and useful method of improving surface morphology, in which the problems described above are eliminated.

Another and more specific object of the present invention is to provide a method of improving the surface morphology of a laser irradiated surface comprising a first step of irradiating a pulse laser beam once or a plurality of times on a region of a conductor layer which is formed on an under layer so as to melt the entire conductor layer, and a second step of irradiating a pulse laser beam on the irradiated region of the conductor layer at least once after the first step with an energy density such that only a surface portion of the conductor layer melts in substantially the entire irradiated region, where the first step irradiates the pulse laser at a first energy density and the second step irradiates the pulse laser at a second energy density which is lower than the first energy density. According to the method of the present invention, it is possible to improve the surface morphology of the conductor layer caused by the pulse laser irradiation. Hence, it is possible to greatly improve the reliability of the conductor material after the pulse laser irradiation.

Still another object of the present invention is to provide the method described above wherein the first step successively irradiates the pulse laser on a plurality of areas within the region with an overlap between two mutually adjacent areas so that the areas irradiated by two successive irradiations are non-adjacent. According to the present invention, it is possible to avoid the undesirable post heating effect and accordingly prevent the conductor material from evaporating after a number of pulse laser irradiations.

Other objects and further features of the present invention will be apparent from the following detailed description when read in conjunction with the accompanying drawings.

DESCRIPTION OF THE PREFERRED EMBODIMENTS

First, a description will be given of the operating principle of the present invention, by referring to FIGS. 2A and 2B.

In the present invention, a pulse laser irradiates a conductor layer a plurality of times in an overlapping manner to temporarily melt the conductor layer and the solidify the conductor layer. Particularly, the overlapping pulse laser irradiation is made with a pulse energy density such that the entire conductor layer melts. Then, after the pulse laser irradiation, a pulse laser irradiates the irradiated region with a pulse energy density such that only the surface portion of substantially the entire irradiated region is melted.

Figure 1:
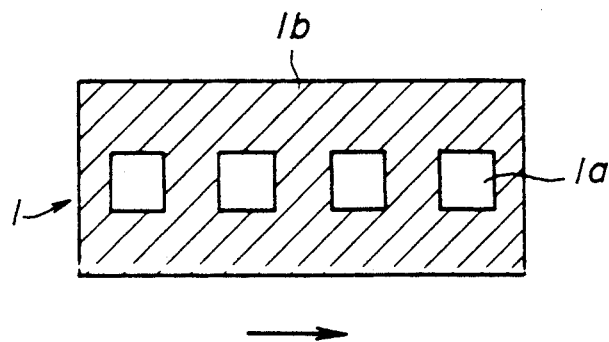
FIG. 1 is a diagram for explaining the deteriorated surface morphology caused by the pulse laser irradiation in the prior art.
Figures 2A, 2B:
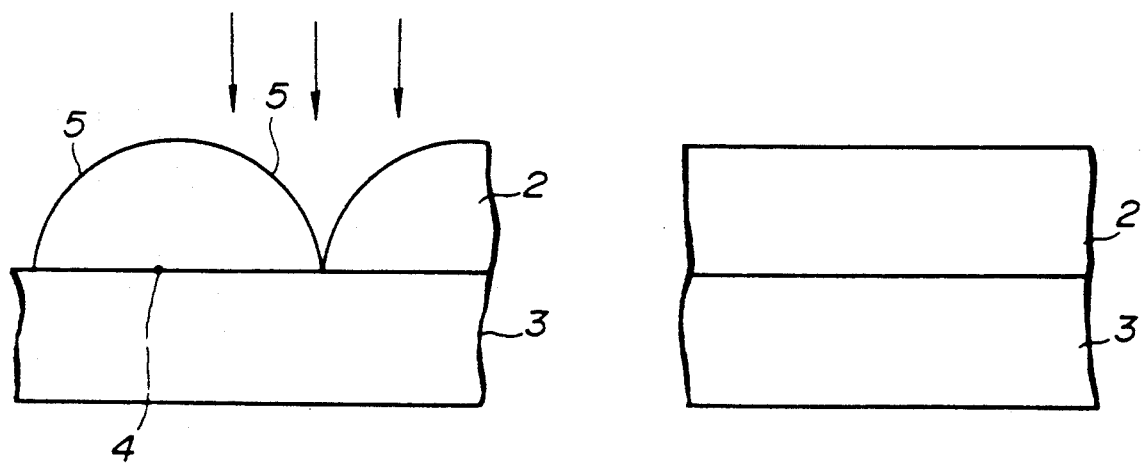
FIGS. 2A and 2B are cross sectional views of a stacked structure for explaining the operating principle of the present invention.

FIG. 2A is a sketch of an SEM photograph taken of a cross section of a stacked structure which is made up of a silicon dioxide ($SiO_2$) underlayer 3 and an aluminum (Al) layer 2 formed thereon. The surface morphology of this stacked structure is deteriorated as shown because the Al layer 2 was subjected to laser irradiation at an energy density of 3 to 4 $J/cm^2$. For example, an excimer laser beam is used as the pulse laser. When the entire Al layer 2 on the $SiO_2$ under layer 3 melts by the heat of the laser, the Al layer 2 does not solidify in a state where the entire surface of the Al layer 2 is smooth. Actually, it may be regarded that the Al layer 2 solidifies in a state where the Al layer 2 contracts in the periphery of a nucleation site 4 and depressions 5 are formed at the surface of the Al layer 2, thereby deteriorating the surface morphology. In addition, it may be regarded that the fine irregularities on the $SiO_2$ underlayer 3 below the region of the Al layer 2 where the energy density of the laser is low causes the nucleation site 4.

Accordingly, it may be regarded that the surface morphology of the Al layer 2 after the laser irradiation deteriorates for the following reasons, that is, (i) the solidification occurs locally on the periphery of the nucleation site 4 and progresses radially from the nucleation site 4, and (ii) the uniform generation of the nucleation sites 4 is difficult due to the existence of the laser energy density distribution.

On the other hand, FIG. 2B is a sketch of an SEM photograph taken of a cross section of the stacked structure when the Al layer 2 is first completely melted by a first laser irradiation and the Al layer 2 is thereafter subjected to a second laser irradiation at a relatively low energy density in the range of 1 to 2 $J/cm^2$ so that only the surface portion of the Al layer 2 slightly melts. It may be seen from FIG. 2B that the melted Al at the surface portion of the Al layer 2 flows into the depressions 5 and a smooth surface can be obtained.

It may be regarded that the smooth Al surface can be obtained by the second laser irradiation for the following reasons although the laser energy density distribution also exists in the second laser irradiation.

(1) First, because the second laser irradiation does not melt the Al at the interface between the $SiO_2$ underlayer 3 and the Al layer 2, no nucleation site 4 is generated.

(2) Second, although nucleation sites are generated within the melted surface portion of the Al layer 2 when the second laser irradiation takes place, the melted Al flows into the depressions 5 before the solidification progresses radially from the nucleation sites and completes.

(3) The phenomenon described under paragraph (2) above is virtually unrelated to the energy density distribution of the pulse laser.

Even when the laser irradiation is made with respect to the already planarized Al layer 2 shown in FIG. 2B at a low energy density in the range of 1 to 2 $J/cm^2$, only the surface portion of the Al layer 2 melts and the surface of the Al layer 2 remains smooth because the Al melting does not take place to an extent such that nucleation sites which become the source of contraction are generated. Hence, when making the second or last laser irradiation, the energy density must be set to a relatively low value so that the surface morphology of the Al layer 2 does not deteriorate.

Therefore, the present invention includes the following basic steps (A) and (B).

The step (A) melts the entire conductor layer by overlapping laser irradiation.

The step (B) melts only the surface portion of the conductor layer after the step (A).

After the step (A), a planarized region and a region with the deteriorated surface morphology coexist on the conductor layer. But since it is difficult to position the pulse laser on one of the two regions, it is necessary to melt substantially the entire surface portion of the conductor layer. The energy density at which the pulse laser melts the surface portion of the conductor layer in the step (B) is not sufficiently high that the via hole and stepped portion of the conductor layer are planarized, and also not sufficiently high that nucleation sites are generated and the solidification occurs in the periphery of the nucleation sites. For this reason, the step (B) uses the flow of melted conductor at the surface portion of the conductor to improve the surface morphology of the conductor layer.

The step (B) may make the laser irradiation in the overlapping manner. But because the periphery of the irradiated region reaches a temperature near the melting point, it is preferable to make the laser irradiation in the form of spots when the pitch of the irradiated regions is small.

When the conductor layer is an interconnection and the state of this interconnection is observed after the step (B), it may be seen that the surface portion of the interconnection, having a thickness in the range of 0.1 to 0.3 $\mu m$, is melted. In general interconnections of semiconductor devices, the melted surface portion of this order is sufficient to fill the depressions and smoothen the interconnection surface.

The present invention includes the basic steps (A) and (B) described above, but an arbitrary number of laser irradiations may be made in each of the steps (A) and (B). Furthermore, additional laser irradiations may be made before or after each of the steps (A) and (B) as long as the effect of smoothening the conductor surface is obtainable. In addition, the present invention is not limited to improving the surface morphology for the purpose of planarizing the conductor surface, and may be used to improve the crystal state of the conductor layer such as crystal defects, the crystal grain and the grain boundary.

When a deteriorated region with the deteriorated surface morphology and a smooth region having no surface morphology deterioration coexist on the conductor layer or even when the entire surface of the conductor layer has surface morphology deterioration, it is possible to improve the surface morphology of the entire irradiated region of the conductor layer while maintaining the smooth surface of the smooth region by irradiating the entire region of the conductor layer at a relatively low energy density so that only the surface portion of the conductor layer melts.

In addition, even in the case of semiconductor devices having via holes or multi-level interconnection, it is possible to improve the surface morphology of the conductor layer by melting the entire conductor layer with the first laser irradiation at a first energy density so as to planarize to a certain extent the via holes and stepped portions, and melting only the surface portion of the conductor layer by the second laser irradiation at a second energy density lower than the first energy density so as to planarize the depressions generated by the first laser irradiation and the via holes and stepped portions which are not completely planarized by the first laser irradiation by the flow of the melted surface portion of the conductor layer.

When the conductor layer is made of Al or silicon (Si), it is difficult to melt the entire conductor layer if the energy density of the pulse laser is less than $3 \text{ J/cm}^2$. On the other hand, the surface morphology of the conductor layer becomes extremely large when the energy density of the pulse laser is greater than $10 \text{ J/cm}^2$. For this reason, the energy density of the first laser irradiation should be set in the range of 3 to $10 \text{ J/cm}^2$. On the other hand, when the energy density of the second or subsequent laser irradiation is less than $1 \text{ J/cm}^2$, it is difficult to melt the surface portion of the conductor layer. In addition, the solidifying phenomenon occurs in the periphery of the nucleation sites when the energy density of the second laser irradiation is greater than $2 \text{ J/cm}^2$. Hence, the energy density of the second laser irradiation should be set in the range of 1 to $2 \text{ J/cm}^2$. The above described ranges of the energy densities for the first and second laser irradiations should be employed when the conductor layer made of Al or Si has a commonly used thickness.

Of course, the conductor layer is not limited to Al and Si. The conductor layer may be made of materials selected from a group consisting of Al, Ti, Cu, Mo, W and alloys thereof.

Next, a description will be given of a first embodiment of the present invention.

Prior to explaining the first embodiment, a first comparison example will be described so as to help appreciate the superior effects obtainable by the first embodiment.

The first comparison example makes a single laser irradiation on an Al layer at a high energy density in the range of 5 to $10 \text{ J/cm}^2$. No further laser irradiation is made thereafter.

Figure 3:
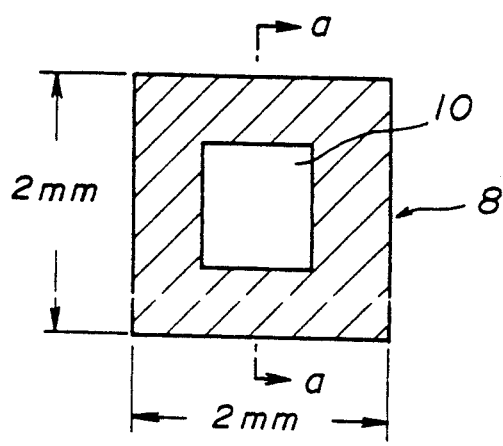
FIG. 3 is a plan view showing a trace of the one shot of the excimer laser in a first comparison example.
Figure 4:
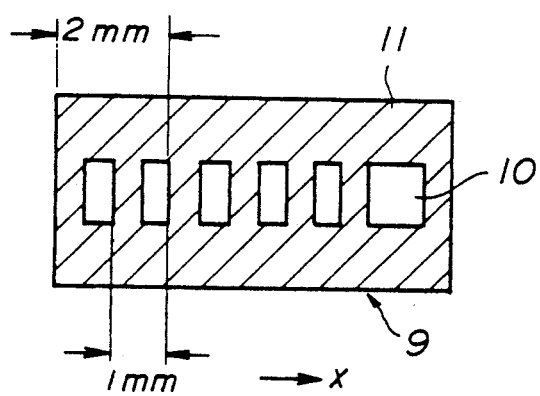
FIG. 4 is a plan view showing the surface state after the overlapping irradiation in the first comparison example.

FIG. 3 shows a trace 8 of one shot of an excimer laser irradiation of the Al layer at an energy density of 5 to $10 \text{ J/cm}^2$ with a beam size of $2 \times 2$ mm. FIG. 4 shows a trace 9 of shots of successive excimer laser irradiations which overlap by 1 mm. In FIGS. 3 and 4, a region 10 has satisfactory surface morphology.

Figure 5:
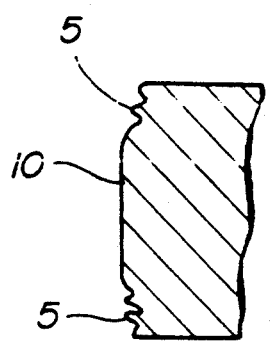
FIG. 5 is a cross sectional view along a line a—a in FIG. 3.

The region 10 which corresponds to the center portion of one shot has a smooth surface because the Al sufficiently melts in this region 10. However, the energy density of the excimer laser decreases towards the periphery of the region 10 and the surface morphology is deteriorated by the generation of the depressions 5 in the periphery of the region 10 as shown in FIG. 5 which shows a cross section along a line a—a in FIG. 3. When such a shot is successively made with an overlap of 1.0 mm in a direction X, a region 11 with the deteriorated surface morphology and the smooth region 10 having the satisfactory surface morphology alternately appear in the direction X as shown in FIG. 4. The depth of the depressions 5 is approximately 1.0 $\mu$m, for example.

In the first embodiment, a second excimer laser irradiation is made on the Al layer at an energy density of 1 to $2 \text{ J/cm}^2$ with the beam size of $2 \times 2$ mm after making a first excimer laser irradiation which is identical to the single excimer laser irradiation employed in the first comparison example described above. The second excimer laser irradiation is made over the same region which is subjected to the first excimer laser irradiation. By the second excimer laser irradiation, the Al in the region 11 with the deteriorated surface morphology (that is, the region where two successive shots of the first excimer laser irradiation overlap) melts again and fills the depressions 5, thereby making the surface of the region 11 smooth. On the other hand, the region 10 where the surface is smooth after the first excimer laser irradiation remains smooth after the second excimer laser irradiation. Therefore, the entire surface of the Al layer becomes smooth by the first and second excimer layer irradiations.

Figure 6:
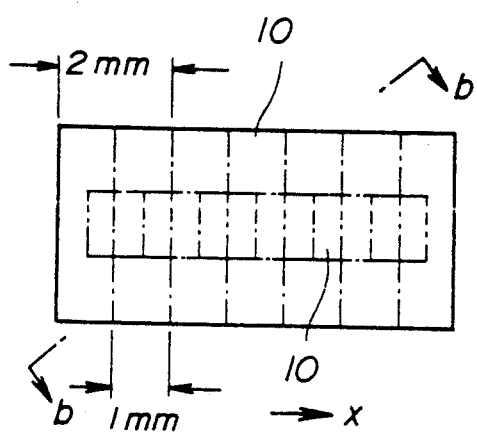
FIG. 6 is a plan view showing the surface state after the irradiation in a first embodiment of the present invention.
Figure 7:
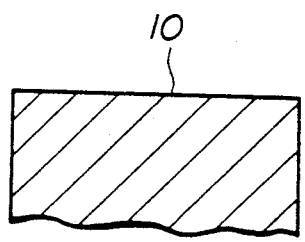
FIG. 7 is a cross sectional view along a line b—b in FIG. 6.

FIG. 6 shows the surface state of the Al layer after the second excimer laser irradiation, and FIG. 7 shows a cross section taken along a line b—b in FIG. 6.

Next, a description will be given of a second embodiment of the present invention.

Prior to explaining the second embodiment, a second comparison example will be described so as to help appreciate the superior effects obtainable by the second embodiment.

The second comparison example makes a single laser irradiation on an Al-Si layer at an energy density in the range of 3 to $4 \text{ J/cm}^2$. No further laser irradiation is made thereafter.

Figure 8:
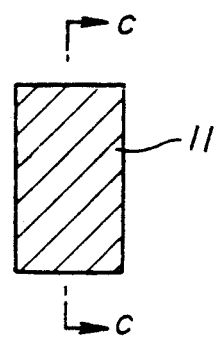
FIG. 8 is a plan view showing a trace of the one shot of the excimer laser in a second comparison example.
Figure 9:
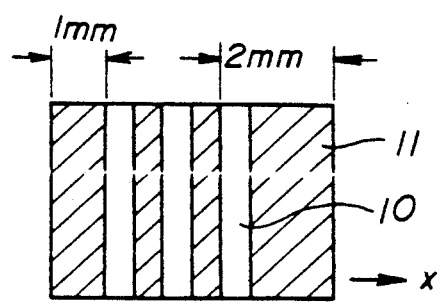
FIG. 9 is a plan view showing the surface state after the overlapping irradiation in the second comparison example.
Figure 10:
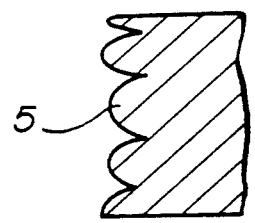
FIG. 10 is a cross sectional view along a line c—c in FIG. 8.

FIG. 8 shows a trace of one shot of an excimer laser irradiation of the Al-Si layer having a thickness of 1.0 $\mu$m at an energy density of 3 to $4 \text{ J/cm}^2$ with a beam size of $2 \times 2$ mm. FIG. 9 shows a trace of shots of successive excimer laser irradiations which overlap by 1 mm. In FIGS. 8 and 9, the entire surface of the Al-Si layer generally has a poor surface morphology because of the insufficient planarization due to the low energy density, although the Al does melt. As a result, the depressions 5 having a depth in the range of approximately 1.0 $\mu$m are formed as shown in FIG. 10. FIG. 10 shows a cross section along a line c—c in FIG. 8. When such a shot is successively made with an overlap of 1.0 mm in the direction X, the smooth region 10 having the satisfactory surface morphology appears slightly within the region 11 with the deteriorated surface morphology as shown in FIG. 9. The region 10 corresponds to the beam edge and the surface morphology is improved in this region 10 because the energy density is in the range of 1 to 2 J/cm² at the beam edge and appropriate for improving the surface morphology. However, in FIG. 9, the planarization of the surface is insufficient for use as an Al interconnection, and the improvement of the surface morphology is insufficient.

Figure 11:
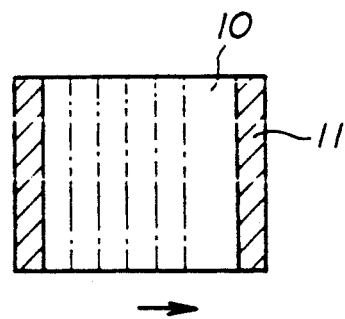
FIG. 11 is a plan view showing the surface state after a first irradiation in a second embodiment of the present invention.
Figure 12:
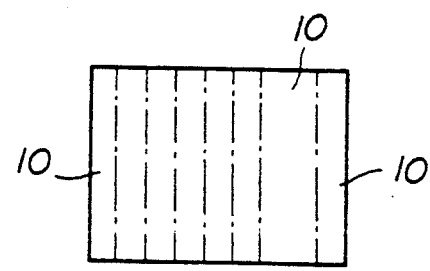
FIG. 12 is a plan view showing the surface state after a second irradiation in the second embodiment of the present invention.

In the second embodiment, a second excimer laser irradiation is made on the Al-Si layer at an energy density of 1 to 2 J/cm² with the beam size of 2 ×2 mm after making a first excimer laser irradiation which is identical to the single excimer laser irradiation employed in the second comparison example described above. The second excimer laser irradiation is made over the same region which is subjected to the first excimer laser irradiation. By the second excimer laser irradiation, the Al in the region 11 with the deteriorated surface morphology melts again and fills the depressions 5, thereby making the surface of the region 11 smooth as shown in FIG. 11, except for the region corresponding to the beam edge of the second excimer laser irradiation. The surface portion of the Al-Si layer cannot be melted at the region corresponding to the beam edge of the second excimer laser irradiation because the energy density of the second excimer laser irradiation is too low at the beam edge, and the depressions 5 remain along the direction X. Hence, a third excimer laser irradiation is required to eliminate the remaining depressions 5. The position of the beam is adjusted so that the center of the beam irradiates the region with the remaining depressions 5, and this third excimer laser irradiation is made under the same conditions as the second excimer laser irradiation. As a result, the entire surface of the Al-Si layer becomes smooth and the surface morphology is improved as shown in FIG. 12 after the first, second and third excimer laser irradiations.

Next, a description will be given of a third embodiment of the present invention. In this embodiment, the first excimer laser irradiation uses one shot of the beam used in FIG. 3. That is, the energy density is 5 to 10 J/cm² and the beam size is 2×2 mm. In addition, the Al in the irradiated region melts at the center portion of the beam while the surface morphology deteriorates in the periphery of the beam. Then, the second excimer laser irradiation is set at the energy density at 1 J/cm² and the beam size of 3+3 mm, so that a second region irradiated by the second excimer laser irradiation overlaps a first region irradiated by the first excimer laser irradiation and the centers of the first and second regions match.

Figure 13:
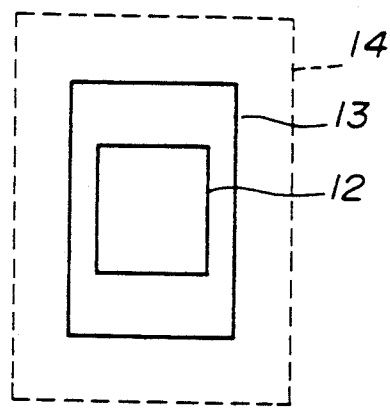
FIG. 13 is a plan view showing the surface state after a first irradiation in a third embodiment of the present invention.

The second excimer laser irradiation improves the deteriorated surface morphology of the region which corresponds to the beam edge of the first excimer laser irradiation. As a result, the entire surface becomes smooth and the surface morphology is improved as shown in FIG. 13. In FIG. 13, a region 12 is smoothened by the first excimer laser irradiation. The beam of the first excimer laser irradiation leaves a trace 13, while the beam of the second excimer laser irradiation leaves a trace 14.

Figure 14:
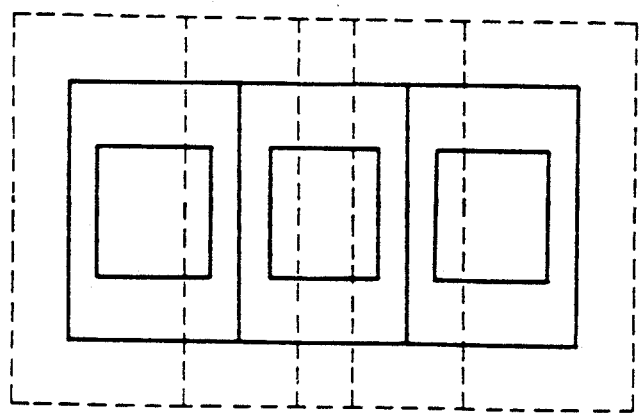
FIG. 14 is a plan view showing the surface state after a second irradiation in the third embodiment of the present invention.

Therefore, in this embodiment, it is possible to obtain a smooth laser irradiated surface shown in FIG. 14 by alternately repeating the excimer laser irradiation with a high energy density and the excimer laser irradiation with a low energy density so that the irradiated regions overlap.

When successively making the pulse laser irradiation on adjacent regions of the conductor layer, it is desirable to set the interval between two successive irradiations to approximately 0.01 second or less, for example, so as to improve the throughput. However, when the interval between the two successive irradiations is short, heat is accumulated in the conductor layer and the underlayer every time the irradiation takes place. As a result, a post heating effect occurs and the later the irradiation process takes place the higher the temperature of the melted conductor reaches.

When the post heating effect occurs, the anneal state becomes different depending on the irradiated position on the conductor layer. For example, when an Al layer is planarized by successively irradiating a pulse layer on adjacent regions of the Al layer to generate a viscous flow, the Al vaporizes as the successive pulse laser irradiation progresses. Even when the irradiating conditions are set so that an optimum viscous flow is generated in a state where no post heating effect occurs, the post heating effect inevitably occurs as the successive pulse laser irradiation progresses. As a result, the temperature reached by the melted Al becomes greater than the vaporizing temperature of Al as the successive pulse laser irradiation progresses.

Next, a description will be given of a fourth embodiment of the present invention in which the above described problem is effectively suppressed.

Figure 15:
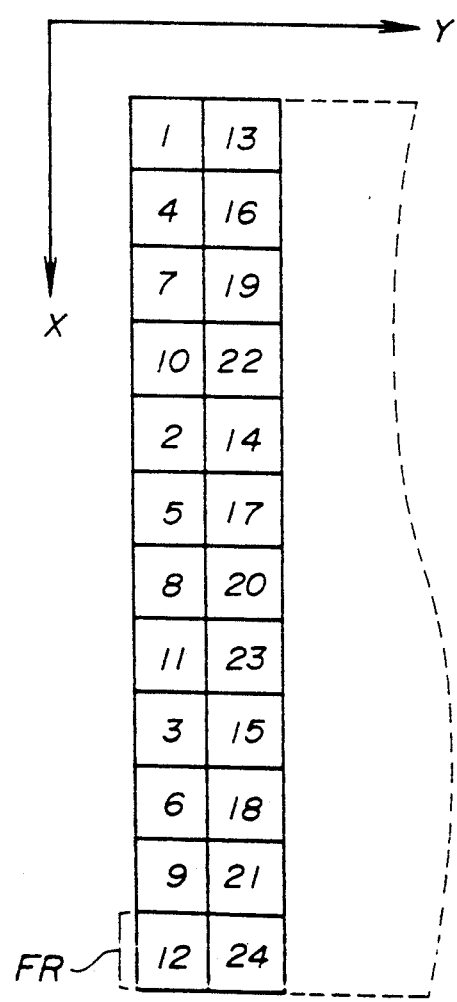
FIG. 15 is a plan view for explaining the irradiating sequence of a fourth embodiment of the present invention.

FIG. 15 is a plan view for explaining an irradiating sequence of the fourth embodiment. In FIG. 15, each square area FR denotes a region which is irradiated by one pulse laser irradiation, and the number indicated within each square area FR denotes the order of the pulse laser irradiations. In other words, the square area FR with the number "1" is irradiated first, the square area FR with the number "2" is irradiated second, and so on. The square area FR may also be regarded as a cross section of the pulse laser beam, that is, a spot of the pulse laser beam.

In this embodiment, the square area FR with the number "1" is first irradiated, and the square area FR with the number "2" is irradiated thereafter. The square area FR with the number "2" is not adjacent to the square area FR with the number "1" but is separated by three spots in the vertical direction from the square area FR with the number "1". In other words, the two successive irradiations are made non-adjacent regions of the conductor layer so that the heat generated by the first irradiation does not affect the second irradiation. The second irradiation is made after the heat accumulation caused by the first irradiation is eliminated. Similarly thereafter, the square area FR with the number "3" is irradiated, and this square area FR with the number "3" is also not adjacent to the square area FR with the number "2". The successive irradiations are made similarly thereafter on the remaining square areas FR of the conductor layer in accordance with a predetermined sequence.

By successively irradiating the non-adjacent square areas FR of the conductor layer, it is possible to prevent heat accumulation in the conductor layer and the underlayer and accordingly prevent the generation of the post heating effect. The temperature reached by the melted conductor is suppressed to approximately the same temperature for each of the successive irradiations and will not reach the vaporizing temperature of the conductor.

Of course, the predetermined irradiating sequence is not limited to that shown in FIG. 15.

This embodiment is particularly suited for application to the first excimer laser irradiation of the first through third embodiments described above.

For example, a Si semiconductor substrate coated with a SiO$_2$ layer of 1 μm is prepared. An Al interconnection layer having a thickness of 1 μm is formed on the SiO$_2$ layer, and the Al interconnection layer is successively irradiated at an irradiation interval of 0.01 second by a pulse laser at an energy density of 7 J/cm$^2$ with a spot size of 2×2 mm. The irradiating sequence shown in FIG. 15 is used. The irradiations are made with an overlap of 0.5 mm between adjacent square areas FR in both the X and Y directions. Furthermore, the timing with which two mutually adjacent square areas FR (for example, the square area FR with the numbers "1" and "4") is set so that the time interval between the end of the irradiation of one of the two mutually adjacent square areas FR and the start of the irradiation of the other of the two mutually adjacent square areas FR is approximately 0.1 second or longer. The pulse laser irradiations may be made on the Al interconnection layer before or after the patterning of the interconnection.

It was confirmed through the experiments that under the above described conditions, the Al of the Al interconnection layer will not evaporate even after approximately 4000 shots of the pulse laser which are required to irradiate the entire surface of a wafer having a diameter of approximately 10 cm.

However, when the irradiations are made under the same conditions but with the irradiations successively made on mutually adjacent square areas FR of the Al interconnection layer, it was confirmed that the evaporation of the Al occurs after only 10 shots of the pulse laser.

Further, the present invention is not limited to these embodiments, but various variations and modifications may be made without departing from the scope of the present invention.

What is claimed is:

1. A method of improving surface morphology of a laser irradiated surface comprising the steps of:

first irradiating a pulse laser beam at least one time on a region of a conductor layer which is formed on an underlayer with a first energy density so as to melt the entire conductor layer, thereby causing portions of a surface of said conductor layer to be non-planarized, and secondly irradiating a pulse laser beam on the irradiated region of the conductor layer at least once after said first irradiating with a second energy density such that only a surface portion of the conductor layer melts in substantially the entire irradiated region, wherein said conductor layer is planarized, thereby improving the surface morphology of said conductor layer, the second energy density being lower than the first energy density.

2. The method as claimed in claim 1, wherein said first irradiating of the pulse laser is performed on a plurality of areas within the region with an overlap between two mutually adjacent areas.

3. The method as claimed in claim 1, wherein said second irradiating of the pulse laser is performed on a plurality of areas within the irradiated region with an overlap between two mutually adjacent areas.

4. The method as claimed in claim 1, wherein said first irradiating of the pulse laser is performed on a plurality of first areas within the region with an overlap between two mutually adjacent first areas, and said second irradiating of the pulse laser is performed on a plurality of second areas within the irradiated region with an overlap between two mutually adjacent areas, the second area having a central portion which overlaps a peripheral portion of at least one of said first area.

5. The method as claimed in claim 1, wherein said first irradiating of the pulse laser on a region of the conductor layer includes the step of irradiating the pulse laser on a region of the conductor layer made of aluminum and silicon at an energy density in a range of 3 to 10 J/cm$^2$, and said second irradiating of the pulse laser includes the step of irradiating the pulse laser at an energy density in range of 1 to 2 J/cm$^2$.

6. The method as claimed in claim 1, wherein said first irradiating of the pulse laser on a region of the conductor layer includes the step of irradiating the pulse laser on a region of the conductor layer made of a material selected from a group consisting of Al, Cu, Mo, W and alloys thereof.

7. The method as claimed in claim 1, wherein said first and second irradiations of the pulse laser are done only once.

8. The method as claimed in claim 1, wherein said first irradiating of the pulse laser is done on a plurality of first areas within the region with an overlap between two mutually adjacent first areas, and said second irradiating of the pulse laser is done on a plurality of second areas within the irradiated region with an overlap between two mutually adjacent second areas, said second area being greater than said first area.

9. The method as claimed in claim 1, wherein said first irradiating of the pulse laser is done on a plurality of areas within the region such that an area irradiated during one first irradiation is not adjacent to an area irradiated during an immediately successive first irradiation, a resulting irradiation of all of the plurality of areas during said first irradiating having an overlap of irradiations between two mutually adjacent areas.

10. The method as claimed in claim 9, wherein said first irradiating of the pulse laser is done on the area within the region so that a time interval between two successive first irradiations is approximately 0.01 second or less.

11. The method as claimed in claim 9, wherein said first irradiating of the pulse laser is done on the areas within the region so that a time interval between when one area is irradiated and when an adjacent area is irradiated is 0.1 second or greater.

12. The method as claimed in claim 9, wherein said first irradiating of the pulse laser on a region of the conductor layer includes the step of irradiating the pulse layer on a region of the conductor layer made of aluminum and silicon at an energy density in a range of 3 to 10 J/cm$^2$, and said second irradiating of the pulse laser includes the step of irradiating the pulse laser at an energy density in a range of 1 to 2 J/cm$^2$.

13. The method as claimed in claim 9, wherein said first irradiating of the pulse laser on a region of the conductor layer includes the step of irradiating the pulse laser on a region of the conductor layer made of a material selected from a group consisting of Al, Ti, Cu, Mo, W and alloys thereof.

* * * * *